United States Patent
Shimomura et al.

(10) Patent No.: US 11,066,755 B2
(45) Date of Patent: Jul. 20, 2021

(54) PLATING APPARATUS AND PLATING METHOD

(71) Applicant: EBARA CORPORATION, Tokyo (JP)

(72) Inventors: Naoki Shimomura, Tokyo (JP); Mizuki Nagai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/434,874

(22) Filed: Jun. 7, 2019

(65) Prior Publication Data
US 2019/0390360 A1    Dec. 26, 2019

(30) Foreign Application Priority Data
Jun. 21, 2018  (JP) .............. JP2018-118164

(51) Int. Cl.
| C25D 17/12 | (2006.01) |
| C25D 17/00 | (2006.01) |
| C25D 17/06 | (2006.01) |
| H01L 21/768 | (2006.01) |
| C25D 3/38 | (2006.01) |
| C25D 5/02 | (2006.01) |
| H01L 21/288 | (2006.01) |
| C25D 21/10 | (2006.01) |
| C25D 21/12 | (2006.01) |

(52) U.S. Cl.
CPC .............. *C25D 17/12* (2013.01); *C25D 3/38* (2013.01); *C25D 5/022* (2013.01); *C25D 17/001* (2013.01); *C25D 17/005* (2013.01); *C25D 17/06* (2013.01); *C25D 21/10* (2013.01); *C25D 21/12* (2013.01); *H01L 21/2885* (2013.01); *H01L 21/76873* (2013.01)

(58) Field of Classification Search
CPC . H01L 21/68785; C25D 21/12; C25D 21/001; C25D 21/005; C25D 5/18
See application file for complete search history.

(56) References Cited

U.S. PATENT DOCUMENTS

| 10,316,426 B2* | 6/2019 | Mine ................ C25D 21/12 |
| 10,513,795 B2* | 12/2019 | Mine ............... C25D 17/001 |
| 2010/0044236 A1* | 2/2010 | Mayer ............. C25D 17/008 |
| | | 205/80 |
| 2013/0001073 A1* | 1/2013 | Noda .................. B05C 3/10 |
| | | 204/275.1 |

FOREIGN PATENT DOCUMENTS

| JP | 03-29876 A | 2/1991 |
| JP | 09-125294 A | 5/1997 |
| JP | 2005-029863 A | 2/2005 |

* cited by examiner

*Primary Examiner* — Nicholas A Smith
(74) *Attorney, Agent, or Firm* — Rothwell, Figg, Ernst & Manbeck, P.C.

(57) ABSTRACT

A substrate holder holds a polygonal substrate Wf. A plating bath accommodates the anode holder and the substrate holder. The anode and the substrate are immersed in a plating solution in the plating bath. A control device controls a current flowing between the anode and the substrate. The substrate holder has power feed members placed along respective sides of the polygonal substrate, and there are a plurality of groups of the sides, each group including at least one side, at least one side being different between the groups. The control device can control, on a group-by-group basis, a current to be supplied to the power feed members.

21 Claims, 14 Drawing Sheets

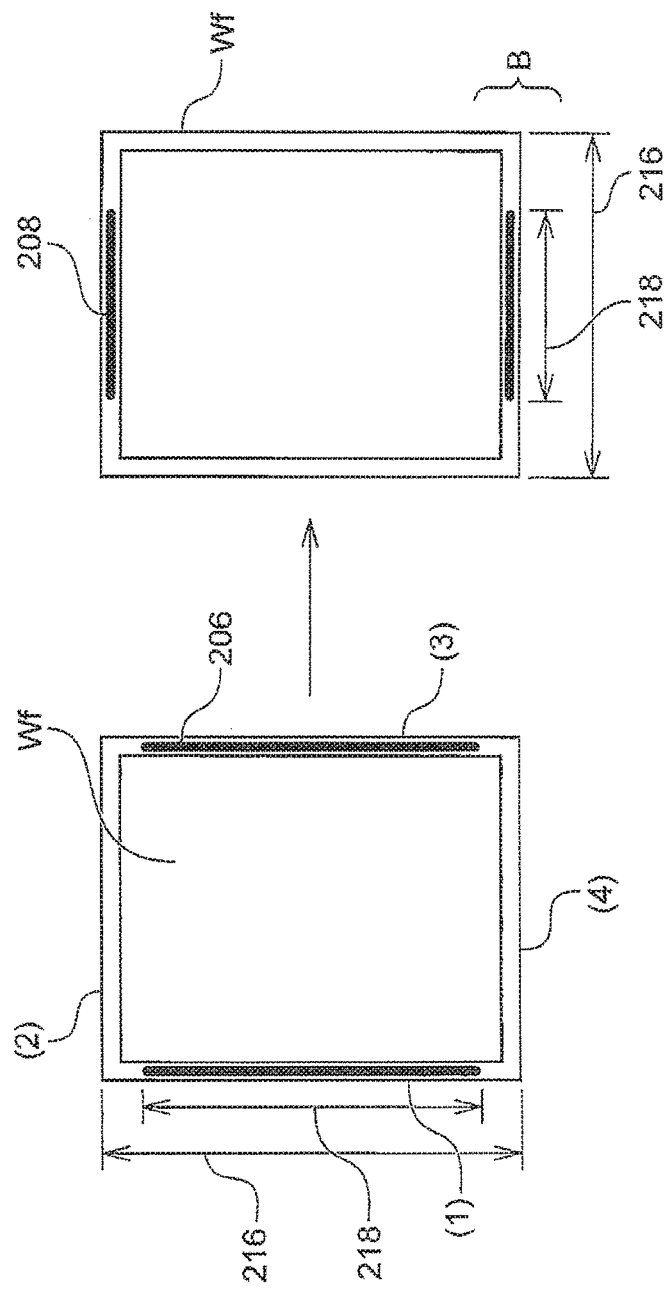

Fig. 16A
Fig. 16B
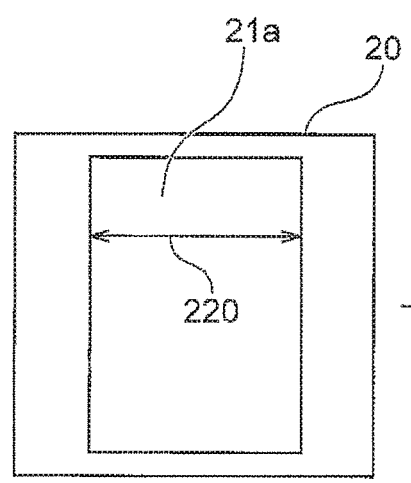
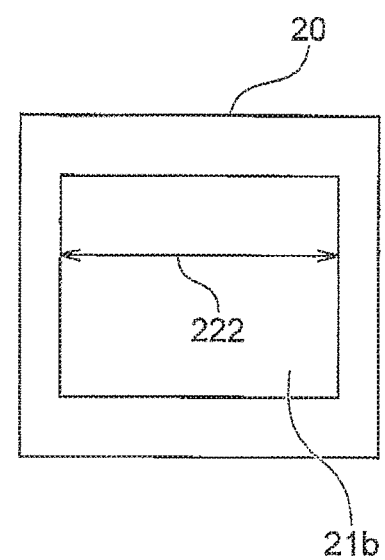

PLATING APPARATUS AND PLATING METHOD

CROSS-REFERENCE TO RELATED APPLICATION

This application is based upon and claims benefit of priority from Japanese Patent Application No. 2018-118164, filed Jun. 21, 2018, the entire contents of which are incorporated herein by reference.

TECHNICAL FIELD

The present invention relates to a plating apparatus and a plating method.

BACKGROUND ART

Conventionally, a wiring is formed in a fine wiring groove, a hole or a resist opening portion provided on a surface of a substrate, such as a semiconductor wafer, and a bump (a protruding electrode) which is electrically connected to an electrode or the like of a package is formed on the surface of the substrate. As the methods for forming wirings and bumps, for example, an electrolytic plating method, a vapor deposition method, a printing method, a ball bump method, etc. have been known. With an increase in the number of I/O and a reduction in pitch on semiconductor chips, the electrolytic plating method which enables miniaturization and relatively stable performance has been increasingly used.

When forming a wiring or a bump by the electrolytic plating method, a seed layer (power feed layer) with low electrical resistance is formed on a surface of a barrier metal provided in the wiring groove, the hole or the resist opening portion on the substrate. A plating film grows on the surface of the seed layer.

In general, a substrate to be plated has electrical contacts on a peripheral edge portion thereof. Therefore, a current corresponding to the combined resistance of an electrical resistance value of a plating solution and an electrical resistance value of the seed layer from a central portion of the substrate to the electrical contact flows to the central portion of the substrate. On the other hand, a current substantially corresponding to the electrical resistance value of the plating solution flows to the peripheral edge portion (the vicinity of the electric contact) of the substrate. In short, the current flows less easily to the central portion of the substrate due to the electrical resistance value of the seed layer from the central portion of the substrate to the electrical contact. This phenomenon in which the current is concentrated in the peripheral edge portion of the substrate is called the terminal effect.

Regarding the shape of the substrate to be plated by the electrolytic plating method, a circular substrate and a quadrangular substrate are known (see, for example, PTL 1 and PTL 2).

On a circular substrate, the distance from the central portion of the circular substrate to the peripheral edge portion of the substrate and the distance between adjacent electrical contacts are the same over the entire periphery of the substrate. Therefore, when plating the circular substrate, the terminal effect occurs substantially uniformly over the entire periphery of the substrate. Hence, when the circular substrate is plated, the plating rate decreases at the central portion of the substrate, and the film thickness of a plating film on the central portion of the substrate is thinner than the plating film on the peripheral edge portion of the substrate. Conventionally, in order to reduce deterioration of in-plane uniformity of film thickness due to the terminal effect, an electric field to be applied to the circular substrate, that is, advection of electroactive ions, is adjusted using, for example, a regulation plate as disclosed in PTL 3 while supplying a current to the electric contacts placed uniformly in the peripheral edge portion of the circular substrate.

CITATION LIST

Patent Literature

PTL 1: Japanese Patent Laid-Open No. 09-125294
PTL 2: Japanese Patent Publication No. 03-029876
PTL 3: Japanese Patent Laid-Open No. 2005-029863

SUMMARY OF INVENTION

Technical Problem

In addition to conventional plating for circular substrates, there is an increasing need of electroplating of (re)wiring, through-via holes, etc. of square (panel) substrates. Regarding electroplating methods for a square substrate, there have been a method in which power is fed from only two sides by mounting power feed electrodes at positions corresponding to only two specific sides of the substrate, and a method in which power is fed from four sides by mounting power feed electrodes at positions corresponding to all the four sides.

Unlike the plating for a circular substrate, the square substrate has corner portions which are more distant from the center of the square substrate compared to other substrate portions. In the case when power is fed by mounting power feed electrodes at positions corresponding to all the four sides, it has been conventionally known that the electric fields tend to be most concentrated in the corner portions. Since the electric fields are most concentrated in the corner portions, the film thickness tends to be higher in the corner portions, and makes it more difficult to ensure in-plane uniformity. As a solution to this problem, in a method, the electric field distribution in a plating solution is partially shielded using an intermediate mask and an anode mask, and thereby limiting an increase in the film thickness in the corner portions and edge portions.

As another solution to this problem, in a method, power is fed only from two sides by mounting power feed electrodes at positions corresponding to only two specific sides of a substrate. In this case, it is possible to limit the film thickness in the corner portions. However, there is a new problem that the film thickness is too low in vicinity portions of the sides of the substrate located slightly inward from the corner portions (both end portions of the sides) toward the central portion of the sides.

When an intermediate mask and an anode mask are used, it is also possible to limit the film thickness in the corner portions. However, similarly to the case of feeding power from two sides, the film thickness is too low in the portions on the sides of the substrate located slightly inward from the corner portions toward the central portion of the sides. In short, this problem occurs regardless of the number of sides to be fed with power (feeding power from two sides or feeding power from four sides). In addition, in the case of trying to control the film thickness in the corner portions, generally, when the film thickness in the corner portions is adjusted by adjusting (narrowing) an opening size in the intermediate mask, the film thickness is lowered in the vicinity of the sides of the substrate as a result of changing the opening size. This tendency does not depend on the number of sides to be fed with power. For such reasons, it was difficult to ensure in-plane uniformity of square substrates.

The present invention has been made in view of the above problem, and one of the objects of the present invention is to improve the in-plane uniformity of a film which is plated on a polygonal substrate.

Solution to Problem

In order to solve the above problem, in Embodiment 1, a plating apparatus is configured, the plating apparatus comprising: an anode holder configured to hold an anode; a substrate holder configured to hold a polygonal substrate; a plating bath configured to accommodate the anode holder and the substrate holder and immerse the anode and the substrate in a plating solution; and a control device configured to control a current flowing between the anode and the substrate, wherein the substrate holder has power feed members placed along respective sides of the polygonal substrate, there are a plurality of groups of the sides, each group including at least one of the sides, at least one of the sides being different between the groups, and the control device is configured to be capable of controlling a current to be supplied to the power feed members, on a group-by-group basis, during plating.

In the present embodiment, there are a plurality of groups of the sides, each group including at least one of the sides, at least one of the sides being different between the groups, and the control device is capable of controlling a current to be supplied to the power feed member, on a group-by-group basis, thereby improving the in-plane uniformity of a film that is plated on the polygonal substrate.

Conventionally, there is only one group consisting of only two sides, or one group consisting of only four sides, and current control is performed for one group. In the present embodiment, there are a plurality of groups of sides, and control can be performed on a group-by-group basis. Unlike the feeding of power only from two specific sides or the feeding of power only from the all four sides as in the prior art, in the present embodiment, it is possible to select any one group including one or more sides and to control the selected group independently of other group.

In the present embodiment, each of the plurality of groups can also be controlled independently, and therefore, for example, when the substrate is rectangular, it is possible to feed power to a group including only two long sides first, and thereafter feed power to a group including only two short sides. Consequently, it is possible to improve the above-mentioned problem that the film thickness is lower in the portions located slightly inward from the corner portions on the sides of the substrate toward the center portion of the sides.

In Embodiment 2, in the plating apparatus according to Embodiment 1, there is no side included in both of arbitrary two groups among the plurality of groups.

In Embodiment 3, in the plating apparatus according to Embodiment 1, the number of the sides is an even number, and when serial numbers are assigned to the even number of the sides so that adjacent sides have successive numbers, the group including the sides assigned with odd numbers and the group including the sides assigned with even numbers are present.

In Embodiment 4, in the plating apparatus according to Embodiment 1, one of the plurality of groups includes a plurality of the sides, and at least one other group different from the one group includes only some of the sides included in the one group.

In Embodiment 5, in the plating apparatus according to any one of Embodiments 1 to 4, the group including the side on which the power feed members to which the current is supplied by the control device when starting plating are placed is different from the group including the side on which the power feed members to which the current is supplied during subsequent plating by the control device are placed.

In Embodiment 6, in the plating apparatus according to any one of Embodiments 1 to 5, the control device is configured to be capable of controlling the current so that a current value when plating is started and a current value during subsequent plating are different.

In Embodiment 7, in the plating apparatus according to Embodiment 6, the control device is configured to be capable of controlling the current to be supplied to the power feed members so that a ratio which is calculated for each of the sides by dividing the sum of lengths of the power feed members to be supplied with the current, in a side direction in which the power feed members are placed, by a length of the side on which the power feed members are placed differs during the subsequent plating compared to the ratio when the plating is started.

In Embodiment 8, in the plating apparatus according to Embodiment 6 or 7, the plating apparatus comprises an electric field shield mask provided between the anode holder and the substrate holder, the electric field shield mask has a polygonal opening along an external shape of the polygonal substrate, and the polygonal opening when the plating is started and the polygonal opening during the subsequent plating differ in at least one of shape and size. The electric field shield mask is an anode mask, an intermediate mask, or a cathode mask. The intermediate mask is also called a regulation plate. In the case where the electric field shield mask is an intermediate mask, the intermediate mask may have a main body part with a polygonal opening along an external shape of the polygonal substrate, and a wall part protruding from an edge of the polygonal opening toward the substrate holder.

In Embodiment 9, a plating method is configured for plating a polygonal substrate by passing a current between an anode and the polygonal substrate, the plating method comprising: a step of bringing power feed members into contact with respective sides of the polygonal substrate; a step of immersing the anode and the polygonal substrate in a plating solution; and a step of controlling a current to be supplied to the power feed members, wherein there are a plurality of groups of the sides, each group including at least one of the sides, at least one of the sides being different between the groups, and in the step of controlling the current, the current to be supplied to the power feed members is controlled, on a group-by-group basis, during plating.

In Embodiment 10, a plating apparatus is configured, the plating apparatus comprising: an anode holder configured to hold an anode; a substrate holder configured to hold a polygonal substrate; a plating bath configured to accommodate the anode holder and the substrate holder and immerse the anode and the polygonal substrate in a plating solution; and a control device configured to control a current flowing between the anode and the polygonal substrate, wherein the substrate holder has power feed members placed along respective sides of the polygonal substrate, and the control device is configured to pass a current independently to a first power feed member placed along a first side of the polygonal substrate and to a second power feed member placed along a second side different from the first side, during plating.

In Embodiment 11, in the plating apparatus according to Embodiment 10, the polygonal substrate is a rectangular substrate, the first power feed members are placed along two opposing sides of the rectangular substrate, and the second power feed members are placed along other two sides orthogonal to the two opposing sides on which the first power feed members are placed.

In Embodiment 12, in the plating apparatus according to Embodiment 10 or 11, the control device is configured to pass the current to the first power feed member during plating, and to pass the current to the second power feed member after a predetermined time has elapsed.

In Embodiment 13, in the plating apparatus according to Embodiment 12, the control device is configured to stop supplying the current to the first power feed member while the current is passed to the second power feed member.

In Embodiment 14, in the plating apparatus according to Embodiment 12, the control device is configured to continue to supply the current to the first power feed member while the current is passed to the second power feed member.

In Embodiment 15, in the plating apparatus according to any one of Embodiments 10 to 14, the control device is configured to increase the current to be supplied to at least either of the first power feed member or the second power feed member, during plating.

In Embodiment 16, in the plating apparatus according to any one of Embodiments 10 to 15, a ratio of a length of a portion of the first side in contact with the first power feed member to a length of the first side is different from a ratio of a length of a portion of the second side in contact with the second power feed member to a length of the second side.

In Embodiment 17, a plating method is configured for plating a polygonal substrate by passing a current between an anode and the polygonal substrate, the plating method comprising: a step of bringing power feed members into contact with respective sides of the polygonal substrate; and a step of immersing the anode and the polygonal substrate in a plating solution, wherein, during plating, a current is independently passed to a first power feed member placed along a first side of the polygonal substrate and to a second power feed member placed along a second side different from the first side.

In Embodiment 18, in the plating method according to Embodiment 17, the current is passed to the first power feed member, and after a predetermined time has elapsed, the current is passed to the second power feed member.

In Embodiment 19, the plating method according to Embodiment 18 further comprises a step of placing an electric field shield mask with an opening portion to partially shield an electric field between the anode and the polygonal substrate, wherein the current is passed to the first power feed member while shielding a region of the polygonal substrate along the first side by the electric field shield mask, and after a predetermined time has elapsed, the opening portion is changed in shape and the current is passed to the second power feed member while shielding a region of the polygonal substrate along the second side by the electric field shield mask.

BRIEF DESCRIPTION OF DRAWINGS

FIGS. 8A, 8B are views showing an embodiment of the present application;

FIGS. 16A, 16B are views showing an embodiment of the present application.

DESCRIPTION OF EMBODIMENTS

Hereinafter, embodiments of the present invention will be described with reference to the drawings. In the following embodiments, the same or corresponding members will be labelled with the same reference signs, and redundant descriptions may be omitted. Moreover, the features shown in each embodiment can also be applied to other embodiment as long as there is no contradiction therebetween.

Figure 1:
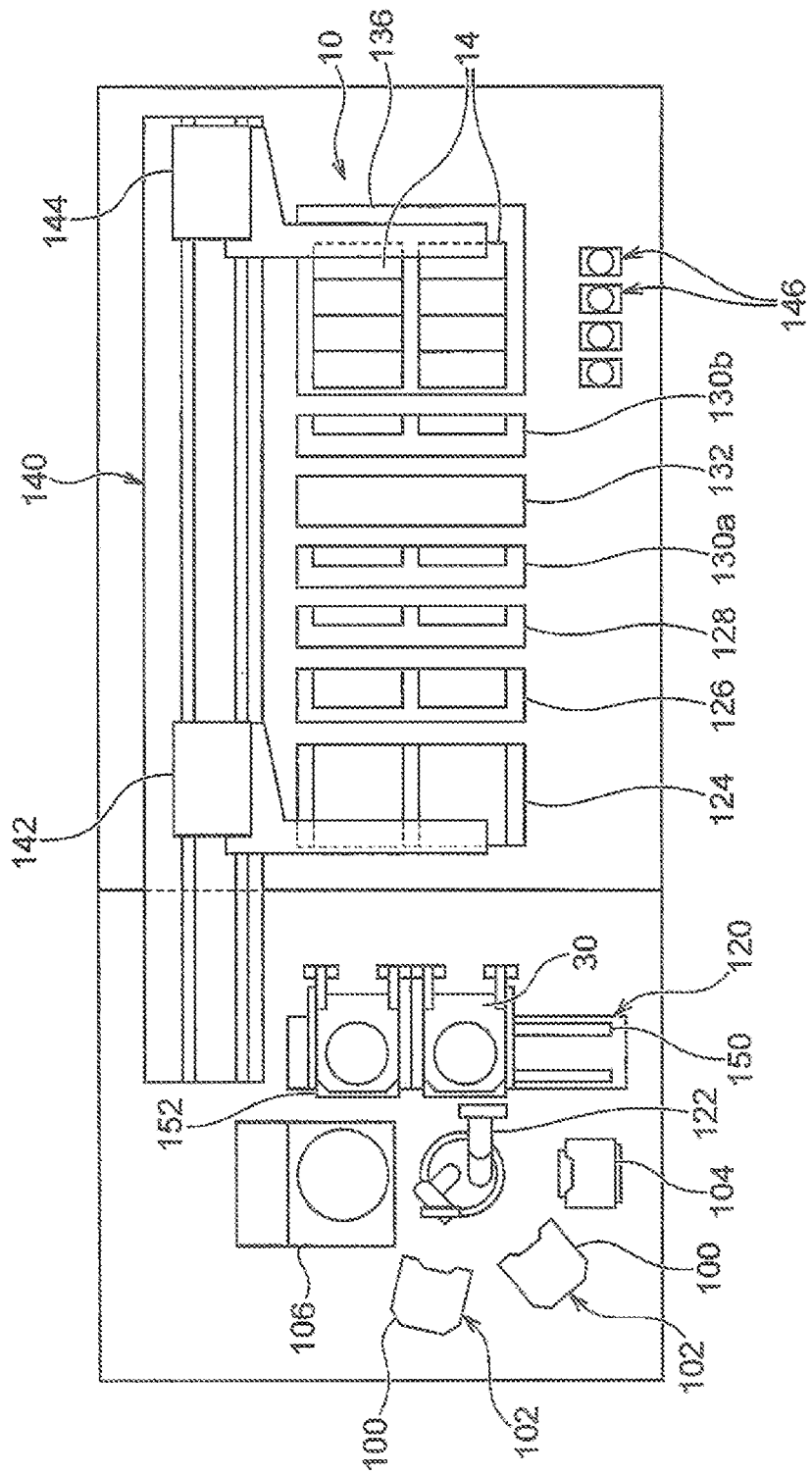
FIG. 1 is an overall layout of an electrolytic plating apparatus of an embodiment.

FIG. 1 shows an overall layout of a plating apparatus of an embodiment. As shown in FIG. 1, the plating apparatus has two cassette tables 102 on which a cassette 100 containing a substrate such as a semiconductor wafer is to be placed, an aligner 104 for aligning positions of an orientation flat, a notch, etc. of the substrate in a predetermined direction, and a spin rinse dryer 106 for drying the substrate after plating by rotating the substrate at high speed. In the vicinity of the spin rinse dryer 106, a substrate attaching/detaching unit 120 where a substrate holder 30 is mounted to attach or detach the substrate is provided. Placed at the center of these units 100, 104, 106 and 120 is a substrate transportation device 122 composed of a transportation robot for transporting the substrate between these units.

There are a stocker 124 for storing and temporarily placing the substrate attaching/detaching unit 120 and the substrate holder 30 thereon, a pre-wet bath 126 for immersing the substrate in pure water, a pre-soak bath 128 for removing by etching an oxide film on a surface of a conductive layer, such as a seed layer, formed on a surface of the substrate, a first cleaning bath 130a for cleaning the substrate after being pre-soaked and the substrate holder 30 with a cleaning liquid (such as pure water), a blow bath 132 for draining the liquid after cleaning the substrate, and a second cleaning bath 130b for cleaning the substrate after being plated and the substrate holder 30 with a cleaning liquid, and a plating unit 10, which are placed in this order.

The plating unit 10 is composed of a plurality of plating baths 14 accommodated in an overflow bath 136. Each plating bath 14 contains one substrate in the inside, immerses the substrate in a plating solution held in the inside, and performs plating such as copper plating on the substrate surface.

The plating apparatus has a substrate holder transportation device 140 which employs, for example, a linear motor method, is located on a side of these units, and transports the substrate holder 30 and the substrate between these units. The substrate holder transportation device 140 has: a first transporter 142 which transports the substrate between the substrate attaching/detaching unit 120, the stocker 124, the pre-wet bath 126, the pre-soak bath 128, the first cleaning bath 130*a* and the blow bath 132; and a second transporter 144 which transports the substrate between the first cleaning bath 130*a*, the second cleaning bath 130*b*, the blow bath 132 and the plating unit 10. The plating apparatus may include only the first transporter 142 without the second transporter 144.

Placed on the opposite side of the substrate holder transportation device 140 across the overflow bath 136 are paddle drive devices 146 for driving paddles 16 (see FIG. 2) which are positioned, as stirring bars, inside the respective plating baths 14 to stir the plating solution in the plating baths 14.

The substrate attaching/detaching unit 120 has a mount plate 152 in the form of a flat plate slidable in a lateral direction along rails 150. Two substrate holders 30 are horizontally mounted side by side on the mount plate 152, and, after delivering the substrate between one of the substrate holders 30 and the substrate transportation device 122, the mount plate 152 is slid in the lateral direction, and a delivery of substrate is performed between the other substrate holder 30 and the substrate transportation device 122.

Figure 2:
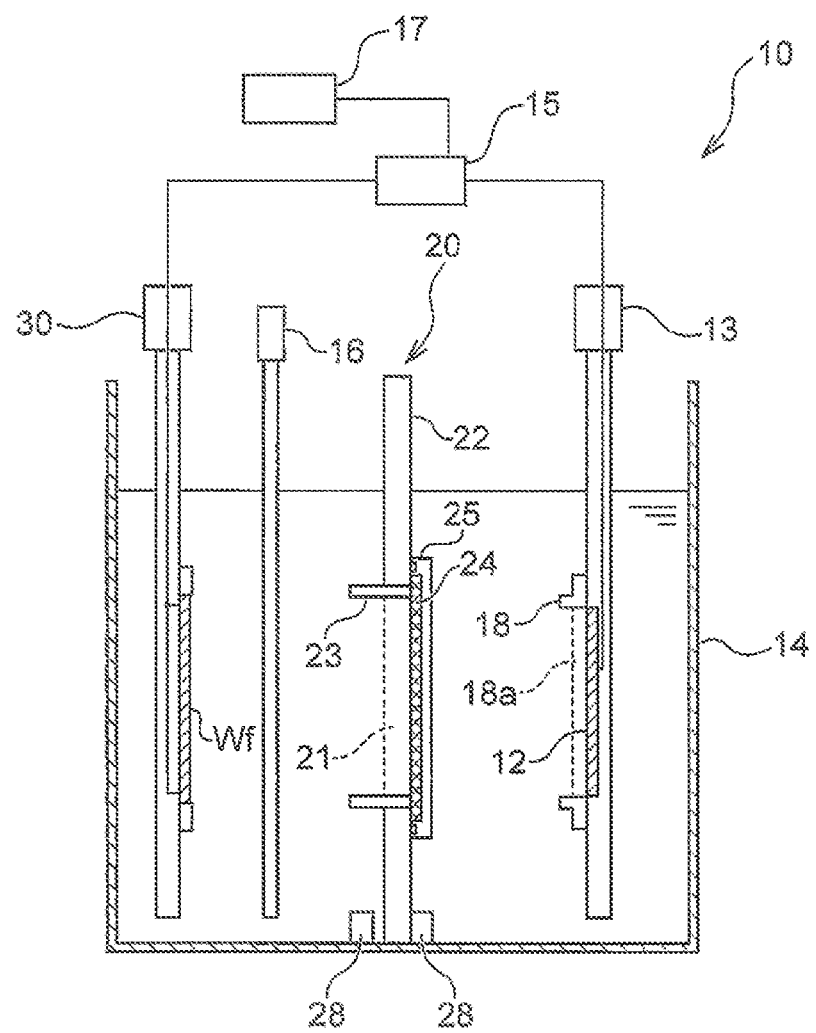
FIG. 2 is a schematic side sectional view (longitudinal sectional view) of a plating unit provided in the plating apparatus.

FIG. 2 is a schematic side sectional view (longitudinal sectional view) of the plating unit provided in the plating apparatus shown in FIG. 1. As shown in FIG. 2, the plating unit 10 has: the plating bath 14 configured to store the plating solution, the substrate holder 30 and an anode holder 13; and the overflow bath (not shown). The substrate holder 30 is configured to hold a polygonal substrate Wf, and the anode holder 13 is configured to hold an anode 12 having a metal surface. The polygonal substrate Wf and the anode 12 are electrically connected through a plating power supply 15, and a plating film is formed on the surface of the substrate Wf by causing a current to flow between the substrate Wf and the anode 12.

The anode holder 13 has an anode mask 18 for adjusting an electric field between the anode 12 and the substrate Wf. The anode mask 18 is a substantially plate-like member made of, for example, a dielectric material, and is provided on a front surface of the anode holder 13. Here, the front surface of the anode holder 13 is the surface facing the substrate holder 30. In short, the anode mask 18 is placed between the anode 12 and the substrate holder 30. The anode mask 18 has a polygonal opening (second polygonal opening) 18*a* at a substantially central portion to pass the current flowing between the anode 12 and the substrate Wf.

The plating unit 10 has a regulation plate 20 for adjusting the electric field between the substrate Wf and the anode 12, and the paddle 16 for stirring the plating solution. The regulation plate 20 is placed between the substrate holder 30 and the anode 12. Specifically, a lower end portion of the regulation plate 20 is inserted between a pair of protruding members 28 provided on a floor surface of the plating bath 14, and the regulation plate 20 is fixed to the plating bath 14. Further, the regulation plate 20 has an arm (not shown) protruding outward near an upper end thereof, and may be suspended and supported in the stocker 124 shown in FIG. 1 by hooking the arm on a peripheral wall top surface of the stocker 124. The paddle 16 is placed between the substrate holder 30 and the regulation plate 20.

The regulation plate 20 is formed of, for example, vinyl chloride that is a dielectric. The regulation plate 20 has a plate-like main body part 22 with a polygonal opening 21 in a substantially central portion, and a wall part 23 protruding from the main body part 22 toward the substrate holder 30. The polygonal opening 21 is in the shape along the external shape of the substrate Wf, preferably slightly smaller than the external shape of the substrate Wf, and quadrangular in the example shown in FIG. 2. The wall part 23 protrudes from the edge of the polygonal opening 21 of the main body part 22 along a direction perpendicular to the plate surface of the main body part 22 (the left-and-right direction in FIG. 2).

When a voltage is applied across the substrate Wf and the anode 12 while the regulation plate 20 is being stored in the plating bath 14, the current from the anode 12 flows through the polygonal opening 21 to the substrate Wf. In other words, the regulation plate 20 shields a part of the electric field formed between the anode 12 and the substrate Wf. Further, the current that has passed through the polygonal opening 21 is guided by the wall part 23 and prevented from spreading to the outside of the substrate Wf. Here, the current is not concentrated relatively near the corner portions of the polygonal substrate Wf, and the current tends to be concentrated relatively near the central portions of the sides of the substrate Wf.

A diaphragm 24 is attached to the regulation plate 20 so as to close the polygonal opening 21. The diaphragm 24 is composed of a cation exchange membrane or a porous membrane, which passes metal ions but does not pass additives. Examples of such a porous membrane include YUMICRON (trade name) from Yuasa. The diaphragm 24 is fixed to the regulation plate 20 by a frame-like fixing plate 25 having an opening corresponding to the polygonal opening 21. The diaphragm 24 and the fixing plate 25 may be attached to the regulation plate 20 from the rear surface (the surface on the anode 12 side). Further, a frame-like seal body corresponding to the shape of the polygonal opening 21 may be provided on a contact surfaces between the regulation plate 20 and the diaphragm 24 and/or the fixing plate 25.

The regulation plate 20 has been described. However, instead of, or in addition to the wall part 23 of the regulation plate 20, the anode mask 18 attached to the anode holder 13 may have a wall part similar to the wall part 23 of the regulation plate 20. That is, the anode mask 18 may have an anode mask main body part with a polygonal opening 18*a* along the external shape of the polygonal substrate Wf, and an anode mask wall part protruding from the edge of the polygonal opening 18*a* of the anode mask main body part toward the substrate holder 30. The polygonal opening 18*a* and the anode mask wall part of the anode mask 18 may have the same dimensions as, or different dimensions from, the polygonal opening 21 and the wall part 23 of the regulation plate 20.

Figure 3:
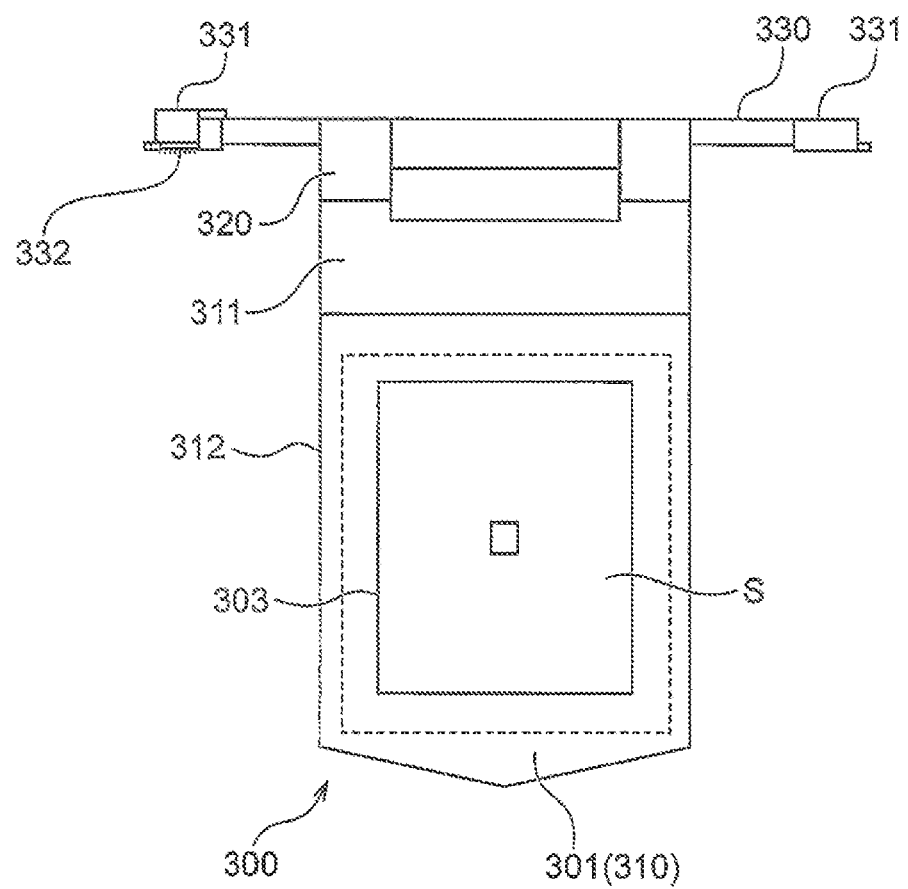
FIG. 3 is a schematic front view of a substrate holder used in the plating unit.
Figure 4:
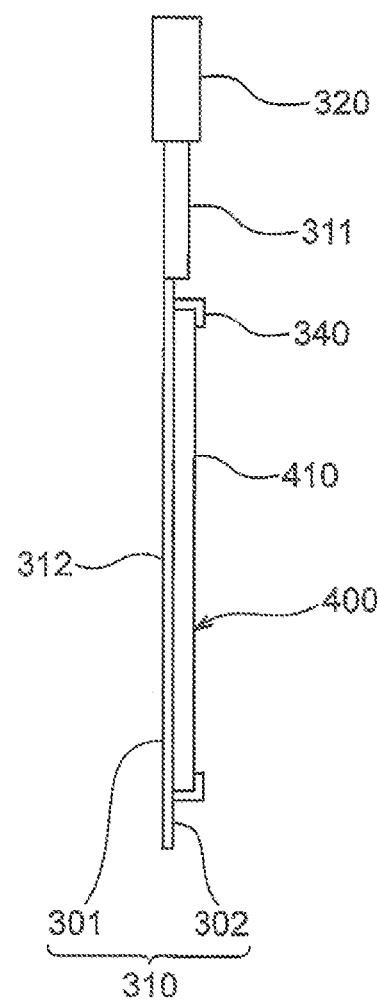
FIG. 4 is a schematic side view of the substrate holder.

Next, the substrate holder 30 will be described. FIG. 3 is a schematic front view of the substrate holder 30 used in the plating unit 10 shown in FIG. 2. FIG. 4 is a schematic side view of the substrate holder 30. The substrate holder 30 includes a front plate 300, and a back plate 400. The substrate Wf is held between the front plate 300 and the back plate 400. In this example, the substrate holder 30 holds the substrate Wf in a state in which one surface of the substrate Wf is exposed.

The front plate 300 includes a front plate main body 310, and an arm part 330. The arm part 330 has a pair of pedestals 331, and the substrate holder 30 is vertically suspended and supported by mounting the pedestals 331 on the peripheral wall top surface of each processing bath shown in FIG. 1. Further, the arm part 330 is provided with a connector 332 which is configured to come into contact with an electrical contact on the plating bath 14 when the pedestals 331 are mounted on the peripheral wall top surface of the plating bath 14. Thus, the substrate holder 30 is electrically connected to an external power supply, and a voltage/current is applied to the polygonal substrate Wf held by the substrate holder 30.

The front plate main body 310 is generally rectangular in shape, has a wiring buffer part 311 and a face part 312, and a front surface 301 and a rear surface 302. The front plate main body 310 is attached to the arm part 330 at two points by an attachment part 320. The front plate main body 310 is provided with an opening portion 303, and a surface of a substrate S to be plated is exposed from the opening portion 303. In the present embodiment, the opening portion 303 is formed in a shape corresponding to the shape of the polygonal substrate Wf.

The back plate 400 is substantially rectangular in shape and covers the rear surface of the substrate Wf. The back plate 400 is fixed by a clamp 340 while sandwiching the substrate Wf with the rear surface 302 (more specifically, the face part 312) of the front plate main body 310. The clamp 340 is configured to rotate about a rotation axis 341 parallel to the surfaces 301, 302 of the front plate main body 310. However, the clamp 340 is not limited to such an example, and may be configured to reciprocate in a direction perpendicular to the surfaces 301, 302 to clamp the back plate 400.

Figure 5:
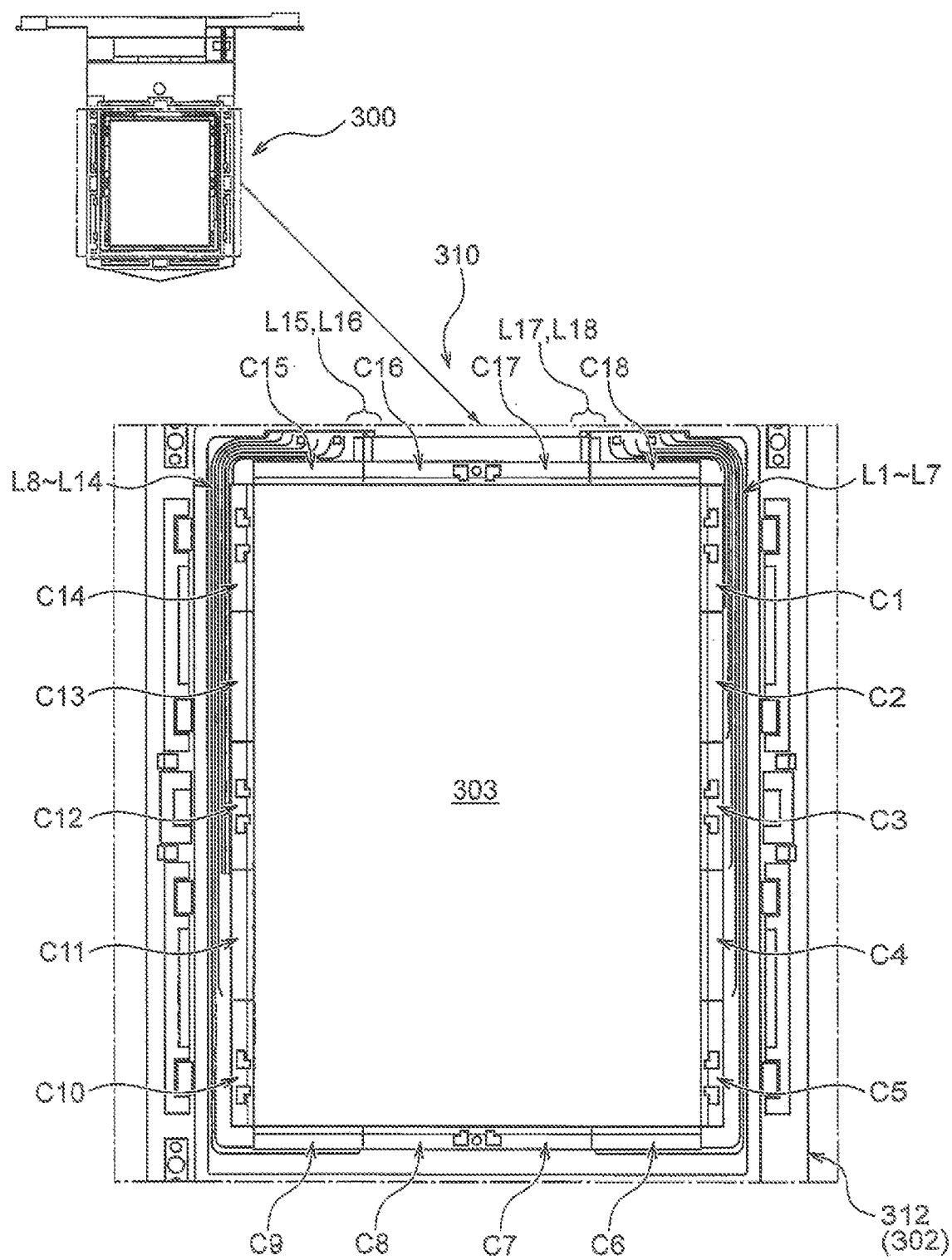
FIG. 5 is a rear view of a front plate main body.
Figure 6:
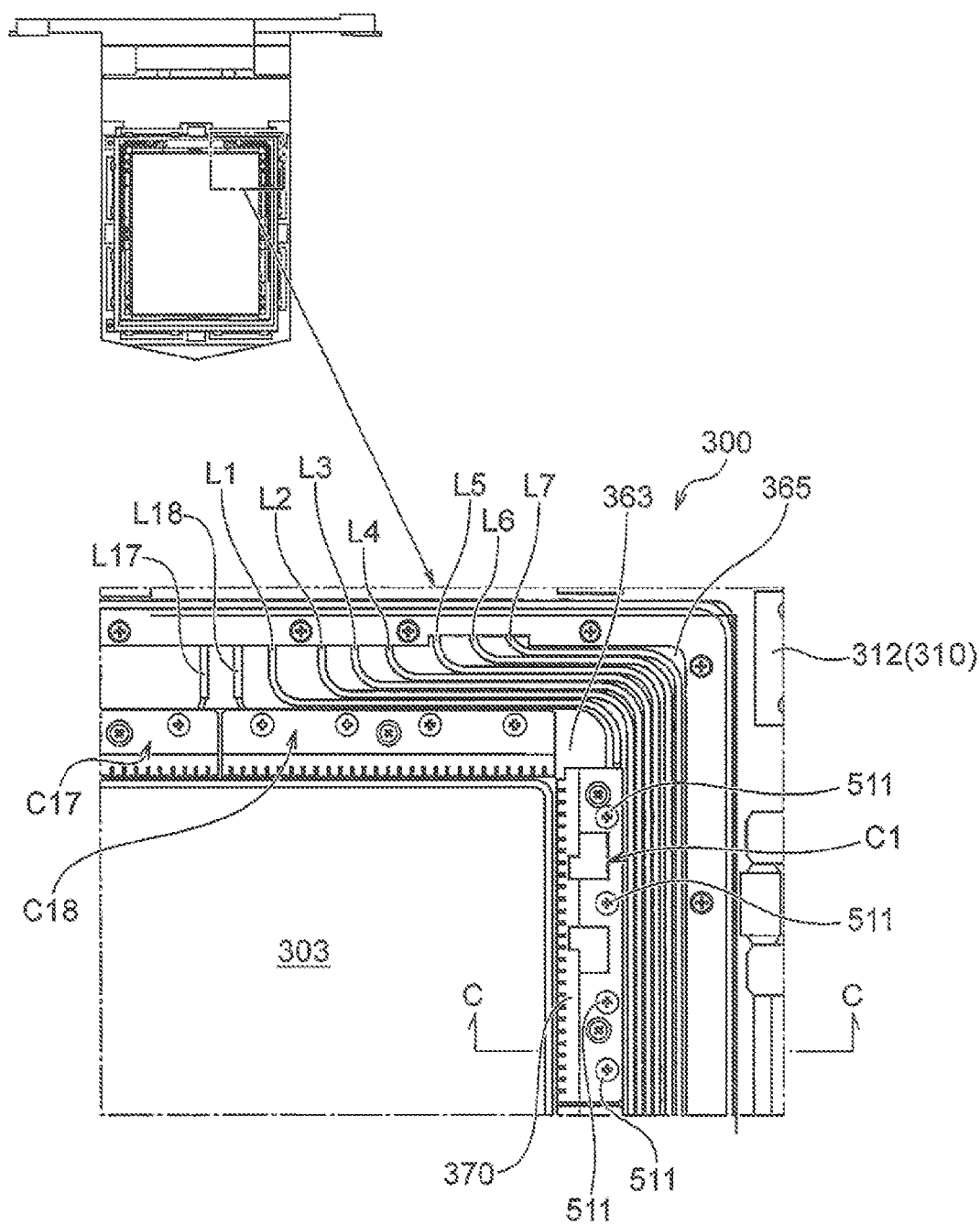
FIG. 6 is an enlarged rear view showing the vicinity of a corner portion of a face part near a connector.

FIG. 5 is a rear view of the front plate main body, and FIG. 6 is an enlarged rear view showing the vicinity of a corner portion of the face part near the connector. The rear surface 302 of the front plate main body 310 has eighteen contact regions C1-C18. The contact regions C1-C5 are placed on the right side of the face part 312. The contact regions C6-C9 are placed on the lower side of the face part 312. The contact regions C10-C14 are placed on the left side of the face part 312. The contact regions C15-C18 are placed on the upper side of the face part 312.

As shown in FIG. 6, each of the contact regions C1-C18 includes a contact 370 (power feed member) for feeding power to the substrate Wf. The contacts 370 are placed along each side of the opening portion 303 of the front panel 300. That is, the contacts 370 are placed along each side of the polygonal substrate Wf. Power is fed from outside to the contacts 370 in the contact regions C1-C18 through cables L1-L18, respectively.

In the following description, cables L1-L18 may be collectively referred to as cables L if the cables do not need to be distinguished. Also, an arbitrary cable may be referred to as the cable L. When it is not necessary to distinguish each of the contact regions, the contact regions C1-C18 may be collectively referred to as contact regions C. In addition, an arbitrary contact region may be referred to as the contact region C.

A first end portion of each of the cables L1-L18 is connected to the connector 332 provided at one end of the arm part 330, more specifically is connected electrically to another contact on the connector 332, or to a common contact (not shown) for a plurality of cables. The cables L1-L18 can be electrically connected to an external power supply (such as a power supply circuit and a power supply device) through the contacts of the connector 332.

The cables L1-L7 are arranged side by side in the same plane and introduced into a cable passage 365, and are placed along a side of the opening portion 303 on the connector 332 side. The cables do not overlap each other in the thickness direction of the face part 312. Therefore, it is possible to limit the thicknesses of the face part 312 and the front panel 300.

Electrical connection between the cable L and the contact 370 in each contact region is made as follows. When the cable L1 is taken as an example, the sheath of the cable L1 is removed at a tip portion (second end portion) of the cable L1, and a core wire (conductive wire) is exposed. The tip portion of the cable L1 is introduced into a wiring groove of a seal holder 363 in the vicinity of the contact C1, and is pressed together with the contact 370 by screws (fastening members) 511 at four points in the contact region C1. That is, the screws (fastening members) 511 and the seal holder 363 clamp the core wire of the cable L1 together with the contact 370. As a result, the cable L1 is electrically connected to the contact 370. When the substrate holder 30 holds the substrate Wf, the contact 370 contacts the substrate Wf, and power is fed from the external power supply to the substrate Wf through the cable L1 and the contact 370. The other contact regions C2-C18 are configured in the same manner, and power is fed to the substrate Wf from the contacts 370 at 18 points.

As described above, in the substrate holder 30 according to the present embodiment, the contacts 370 are provided on each side of the polygonal substrate Wf, and power is fed to the substrate Wf from the contacts 370 provided on each of the sides. Consequently, a plating film is formed on the surface of the substrate Wf.

While the quadrangular substrate Wf has been described above, the present invention is not limited to this, and the substrate Wf in the shape of a triangle, or a polygon with five or more sides, can be plated in the same process. In such a case, an opening in the shape of a triangle or a polygon with five or more sides along the shape of the substrate Wf also just needs to be formed in the anode mask 18 and the regulation plate 20. Further, the power feed members just need to be placed along the respective sides of the polygonal substrate.

The plating unit 10 further includes a power supply 15, and a control device 17 for controlling the power supply 15. The power supply 15 is electrically connected to the anode 12 and the substrate Wf, and is configured to cause a current to flow between the anode 12 and the substrate Wf. The control device 17 controls the power supply 15, and is thereby capable of controlling the current so that currents of different values are supplied to the contact regions C, respectively, of the substrate holder 30.

The control device 17 is configured to be capable of controlling, for each group of sides, the current to be supplied to the power feed members 370. Regarding the sides of the substrate Wf, there are a plurality of groups of sides, each group including at least one side, and at least one side is different between the groups. In order to control each group of sides, for example, in the power supply 15, five cables L from the contact regions C1-C5 placed on one side (for example, the right side) in the face part 312 are connected to one cable. An embodiment using this connection example will be described with reference to FIGS. 7A, 7B, 7C.

It should be noted that the cables L to be connected to one cable are not necessarily all of the five cables L from the contact regions C1-C5 placed on one side (for example, the right side), and may be only the cables L from the contact regions C2-C4 placed to the central portion. An embodiment using this connection example will be described later as an example shown in FIGS. 8A, 8B. In the example of FIGS. 8A, 8B, the control device 17 can control each of the individual contact regions C independently.

Figure 7A:
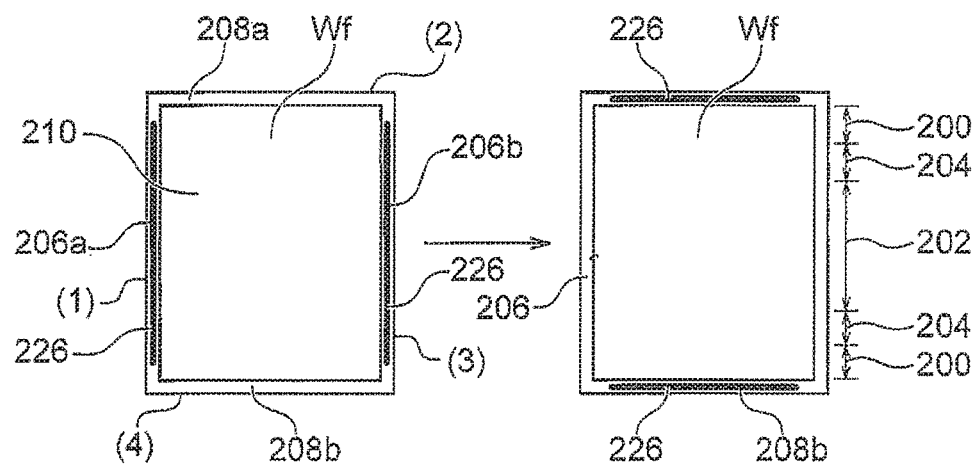
FIGS. 7A, 7B, 7C are views showing an embodiment of the present application.
Figure 7B:
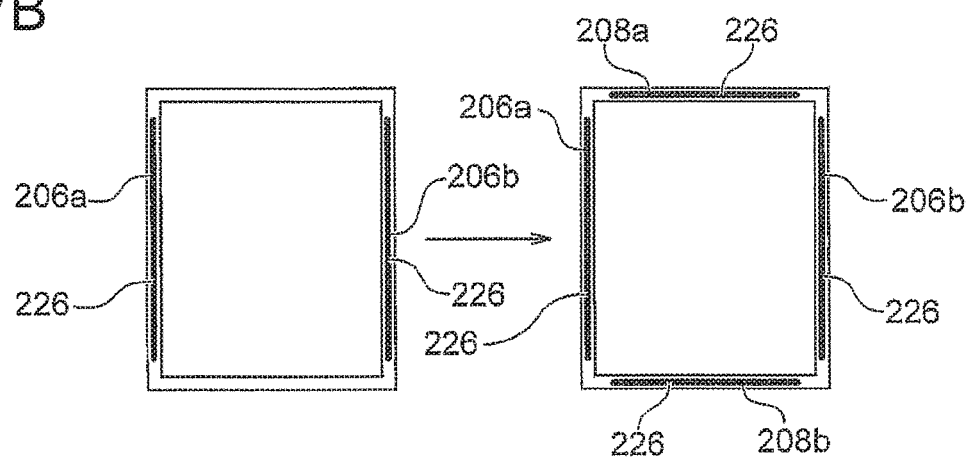
Figure 7C:
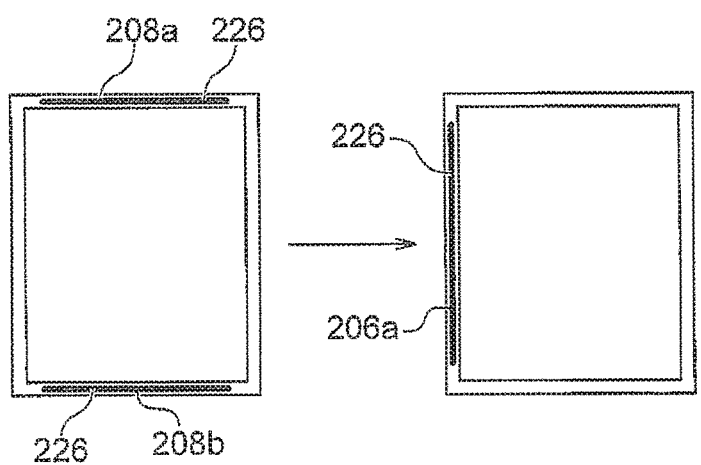

FIGS. 7A, 7B, 7C show three different embodiments. In FIGS. 7A, 7B, 7C, the control device 17 is configured to be capable of controlling a current to be supplied to the contacts 370 so that sides on which the contacts 370 to which the current is supplied when starting plating are placed and sides on which the contacts 370 to which the current is subsequently supplied are placed are at least partly different. In FIG. 7A, the current is supplied only to the contacts 370 placed on the front plate main body 310 corresponding to two long sides 206 of the rectangular substrate Wf when starting plating. Subsequently, the current is supplied only to the contacts 370 placed on the front plate main body 310 corresponding to two short sides 208. FIGS. 7A, 7B, 7C show regions 226 on the substrate Wf which are in contact with the contacts 370 to which the current is supplied (the regions where power is fed to the substrate Wf). In FIGS. 7A, 7B, 7C, the inside of the substrate Wf excluding the sides is a plating area 210 to be plated. Further, in FIGS. 7A, 7B, 7C, the left side drawings show the sides to which power is fed when starting plating, and the right side drawings show the sides which are plated thereafter. For example, in the case of FIG. 7A, the regions 226 to which power is fed when starting plating are on long sides 206a, 206b, and the regions 226 to which power is fed subsequently are on short sides 208a, 208b.

FIGS. 7A and 7C are embodiments showing that "there is no side included in both of arbitrary two groups among a plurality of groups", wherein the plurality of groups are two groups. In FIG. 7A, one group consists of the long sides 206a, 206b, and the other group consists of the short sides 208a, 208b. In other words, in FIG. 7A, the number of the sides is an even number (four), and serial numbers (1 to 4 in FIG. 7A) are assigned to the even number of sides so that adjacent sides have successive numbers. There are the group including odd-numbered sides (the group consisting of the long sides 206a, 206b) and the group including even-numbered sides (the group consisting of the short sides 208a, 208b).

In FIG. 7C, one group consists of two short sides 208a, 208b, and the other group consists of only the long side 206a. In FIG. 7A, 7B, 7C, the group including the sides on which the power feed members 370 to which the current is supplied by the control device 17 when starting plating is placed is different from the group including the side on which the power feed member 370 to which the current is supplied subsequently by the control device 17 is placed.

In FIG. 7B, one group, among a plurality of groups, includes a plurality of sides, and at least one other group different from the one group includes only some of the plurality of sides included in the one group. Specifically, one group consists of two long sides 206a, 206b, and another group consists of four sides, namely long sides 206a, 206b and short sides 208a, 208b.

According to the embodiment of FIG. 7A, the following advantageous effects are obtained. As described above, in the case where there is only one group and power is fed from the fixed two sides, or four sides, included in the one group, the film thickness is likely too low in the vicinity of intermediate portions 204 located slightly inward from the corner portions 200 on a side of the substrate Wf toward a central portion 202 of the side in FIG. 7A. According to the embodiment of FIG. 7A, since power is fed to the group consisting of two short sides 208a, 208b after feeding power to the group consisting of two long sides 206a, 206b, it is possible to reduce the difference between the film thickness in the vicinity of the intermediate portions 204 and the film thicknesses in the vicinity of the corner portions 200 and the central portion 202.

In FIG. 7B, when starting plating, the current is supplied only to the contacts 370 placed on the front plate main body 310 corresponding to the group consisting of two long sides 206a, 206b of the rectangular substrate Wf. Subsequently, the current is supplied to the contacts 370 placed on the front plate main body 310 corresponding to the group consisting of the long sides 206a, 206b and short sides 208a, 208b.

In FIG. 7C, when starting plating, the current is supplied only to the contacts 370 placed on the front plate main body 310 corresponding to the group consisting of two short sides 208a, 208b of the rectangular substrate Wf. Subsequently, the current is supplied only to the contacts 370 placed on the front plate main body 310 corresponding to the group consisting of one long side 206a.

Which of the embodiments of FIGS. 7A to 7C is to be adopted for plating is determined based on a desired plating pattern, the surface characteristics of the substrate Wf, the results of plating already performed, etc. Conventionally, regarding a feed side to which the current is supplied, either feeding power to fixed two sides of the long sides 206 or the short sides 208, or feeding power to four sides in which power is fed fixedly to all the sides is used. In the present embodiments, as shown in FIGS. 7A, 7B, 7C, the feed side is not limited to two sides or four sides, and one to four sides can be arbitrarily selected. Moreover, when a side to be selected is changed during plating, sides that can be selected before and after the change are arbitrary. In the examples of FIGS. 7A, 7B, 7C an electric field shield mask may not be necessarily used.

In the embodiments of FIGS. 7A to 7C, the control device 17 is configured to pass a current independently to the first power feed member placed along the first side 206 of the rectangular substrate Wf and to the second power feed member placed along the second side 208 different from the first side 206, during plating. In the embodiments of FIGS. 7A to 7C, the first power feed members are placed along two opposing sides 206 of the rectangular substrate Wf, and the second power feed members are placed along other two sides 208 orthogonal to the two opposing sides 206 on which the first power feed members are placed.

Next, another embodiment will be described with reference to FIGS. 8A, 8B. Regarding the techniques of plating the substrate Wf, there is a known plating method, generally called a step current, in which a current is applied while changing the current value in a plurality of steps. That is, a method in which the current value when plating is started and the subsequent current value are different is known. In the present embodiment, in addition to the step current, plating is performed by switching a side, or the contacts within a side, to which power is fed in each step. It is possible to perform plating by selecting a side to be fed with power, or contacts within one side to be fed with power, a current value in each step, the application time, and the number of steps according to required specifications for plating.

In each step, a side to be fed with power is selected under the control of the control device 17. Plating is performed by selecting two sides on the long sides 206 as the feed sides when starting plating. Subsequently, plating is performed by selecting two sides on the short sides 208 as the feed sides. That is, in FIGS. 8A, 8B, the number of the sides is an even number (four), and serial numbers (1 to 4 in the drawing) are assigned to the even number of sides so that adjacent sides have successive numbers. In FIGS. 8A, 8B, the numbers (1) to (4) are given, for example, clockwise as illustrated.

The control device 17 is configured to be capable of controlling a current so that the current to be supplied to the odd-numbered power feed members on the long sides 206 and the current to be supplied to the even-numbered power feed members on the short sides 208 at this time are independent. At this time, the current value may be the same as, or different from, that in the first step. In order to restrict an increase in the film thickness in the corner portions 200, the electric field between the anode 12 and the substrate Wf is partially shielded by the intermediate mask 20 and the anode mask 18.

Figure 9:
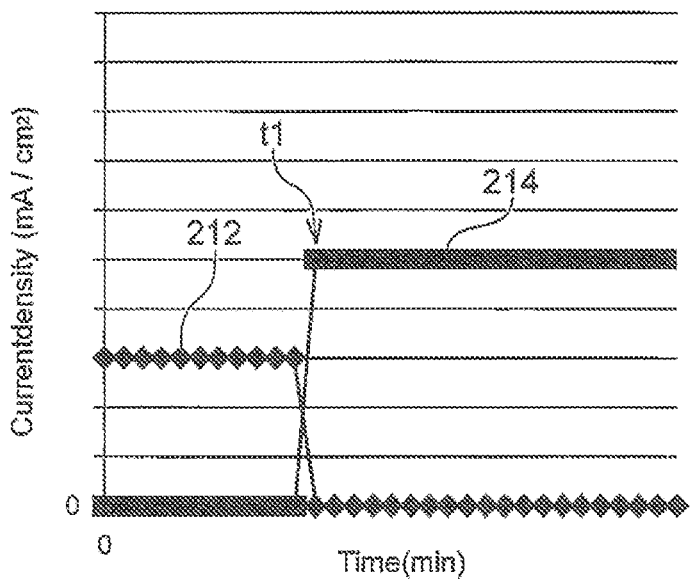
FIG. 9 is a view showing the currents to be applied to contacts.

An example of the current value at this time is shown in FIG. 9. The horizontal axis in FIG. 9 shows the time (minutes), and the vertical axis indicates the current value (mA/cm$^2$). A graph 212 indicates a first current that is a current supplied to the power feed members on the long sides 206. A graph 214 indicates a second current that is a current supplied to the power feed members on the short sides 208. The plating start time is indicated as "0". After starting plating, the current is applied to the short sides 208 from a certain time (t1). The current being applied to the long sides 206 until the certain time (t1) is turned off. When the current is applied as shown in FIG. 9, the plating apparatus can be operated by one power supply 15 (rectifier).

Figure 10:
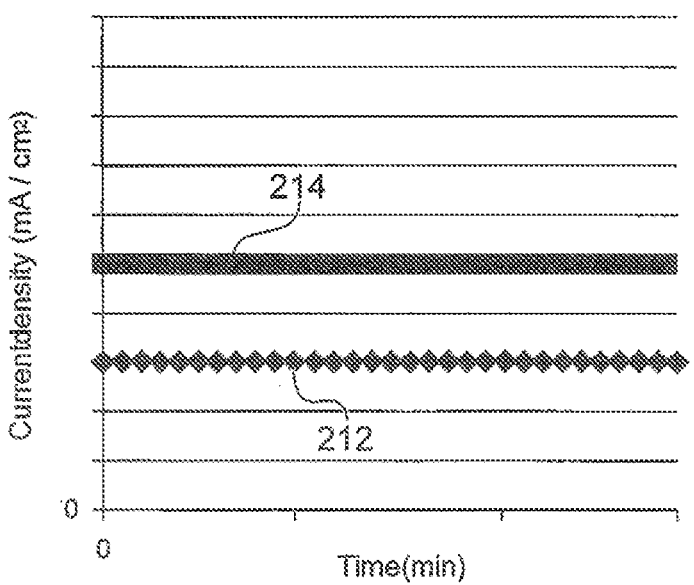
FIG. 10 is a view showing the currents to be applied to contacts.
Figure 11:
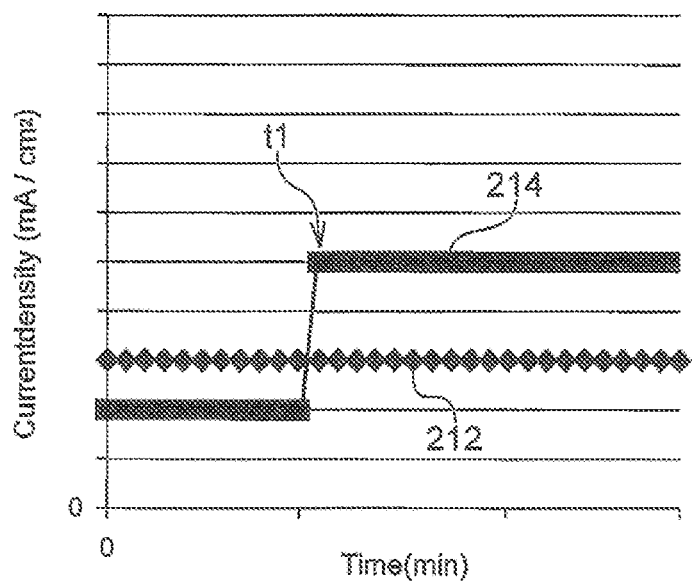
FIG. 11 is a view showing the currents to be applied to contacts.
Figure 12:
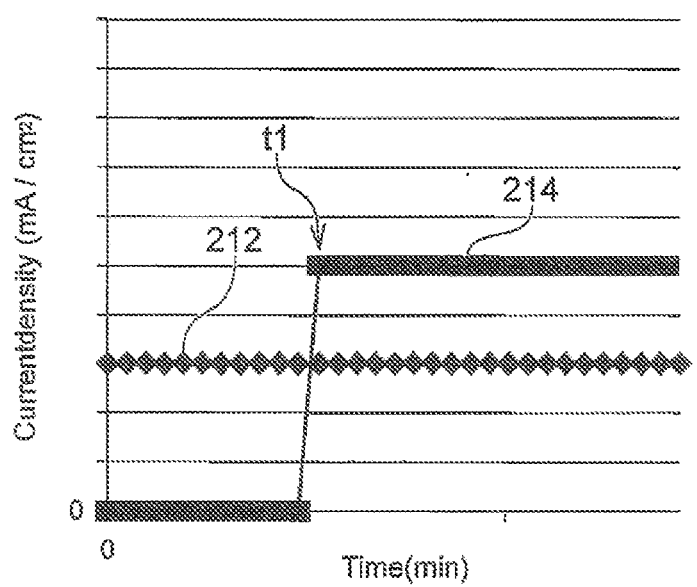
FIG. 12 is a view showing the currents to be applied to contacts.

Regarding the application pattern of current value, the following patterns are also available. In FIGS. 10 to 12 below, similarly to FIG. 9, the horizontal axis shows the time (minutes), the vertical axis indicates the current value (mA/cm$^2$), and the graph 212 indicates the first current that is the current supplied to the power feed members on the long sides 206. Further, the graph 214 indicates the second current that is the current supplied to the power feed members on the short sides 208. In FIG. 10, the current always flows to the four sides and the current value is constant, but there is a difference in current value between the long side 206 and the short side 208. The current value flowing to the short side 208 is larger than the current value flowing to the long side 206.

In FIG. 11, the current always flows to the four sides, and there is a difference in current value between the long side 206 and the short side 208, and further the current value flowing to the long side 206 is constant. The current value flowing to the short side 208 is smaller than the current value flowing to the long side 206 until the certain time (t1), but is larger than the current value flowing to the long side 206 after the certain time (t1).

The current value is smaller until the certain time (t1), and the reason why the current value is larger after the certain time (t1) is as follows. Immediately after starting plating, the plating film is thin, an electrical resistance is large, and there is also a large difference (variation) in the electrical resistance among the end portions, the central portion and the intermediate portions of the sides. In this state, if the current value is large, the variation in the plating film thickness becomes larger. Therefore, immediately after starting plating, the current value is controlled to be smaller, and the current value is increased when the plating film thickness is increased and the electrical resistance becomes smaller (the variation becomes smaller).

The example shown in FIG. 11 is different from the example shown in FIG. 10 in that the current value flowing to the contact 370 is changed during plating. That is, the current value flowing to the short side 208 is gradually increased during plating. The reason will be described further. In the central portion 202 of the side 206 of the substrate Wf, the electric field is concentrated in the initial stage of plating due to the terminal effect, and the current becomes smaller as the plating progresses. Therefore, in the initial stage of plating in which the electric field is concentrated, the density of current is made relatively small. In the mid stage of plating in which the current in the central portion 202 becomes relatively smaller compared to other portions, the density of current is made relatively large. Thus, since the current value is changed according to the terminal effect, the in-plane uniformity of the film thickness can be further improved compared to the example of FIG. 10 in which the constant current is continuously passed.

In FIG. 12, the current is passed to only the long side 206 until the certain time (t1). After the certain time (t1), the current is passed to the four sides, and the current value differs between the long side 206 and the short side 208. After the certain time (t1), the current value flowing to the short side 208 is larger than the current value flowing to the long side 206. According to the current application method shown in FIGS. 11 and 12, compared to FIG. 10, there is a possibility of increasing the effect of equalizing the film thickness of plating when there is anisotropy in the seed film thickness in the substrate Wf. As a result, the degree of freedom in the method of controlling the film thickness of plating is increased.

In FIGS. 9 and 12, the control device 17 passes the current to the first power feed member during plating, and passes the current to the second power feed member after elapse of a predetermined time. In FIG. 9, the control device 17 stops supplying the current to the first power feed member while the current is passed to the second power feed member.

In FIG. 12, the control device 17 continues to supply the current to the first power feed member while the current is passed to the second power feed member. In FIG. 11, during plating, the control device 17 increases the current to be supplied to at least either of the first power feed member or the second power feed member.

Figure 13:
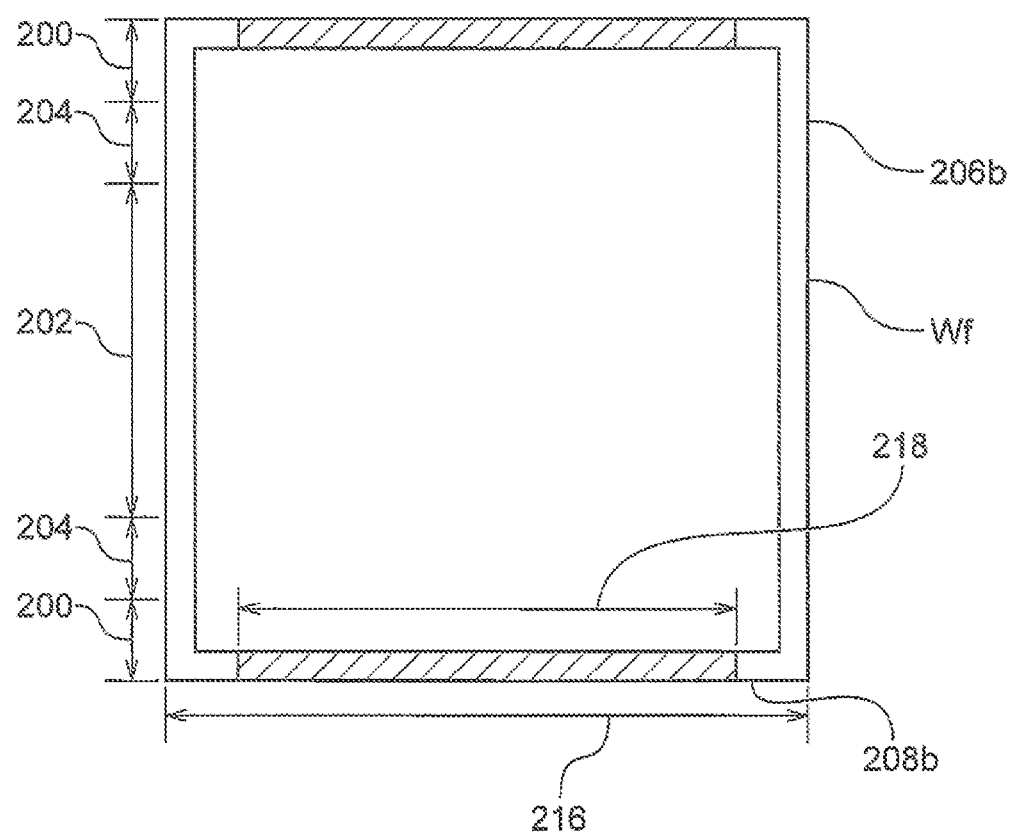
FIG. 13 is a view showing an embodiment of the present application.

In FIGS. 13, 14 and 15, the ratio of the length 218 of a portion of the first side 206 in contact with the first power feed members to the length 216 of the first side 206 is different from the ratio of the length 218 of a portion of the second side in contact with the second power feed members to the length 216 of the second side.

Although the currents shown in FIGS. 9 to 12 are also applicable to FIGS. 7A, 7B, 7C and 8A, 8B, the embodiment shown in FIGS. 8A, 8B has characteristics other than the application patterns of current value. This will be described with reference to FIG. 13. FIG. 13 is an enlarged view of FIG. 8B. In FIG. 13, the control device 17 is configured to be capable of controlling, for each side, a current to be supplied to the contacts 370 so that a ratio calculated by dividing the sum 218 of the lengths of the contacts 370 supplied with the current, in a side direction in which the contacts 370 are placed, by the width 216 (length) of the side on which the contacts 370 are placed differs in the subsequent plating compared to the ratio when the plating is started.

In the plating in the beginning first stage shown in FIG. 8A, the film thickness in the intermediate portions 204 near the end portions on the long side is decreased instead of restricting the increase in the film thickness in the corner portions 200 as described above. In the plating in the subsequent second stage shown in FIG. 8B, the ratio of the sum 218 of the lengths of the power feed portions to the width 216 of the side (the sum 218 of the lengths of the power feed portions/the width 216 of the side) is smaller compared to the ratio in the first stage. Hence, while restricting the increase in the film thickness in the corner portions 200, the intermediate portions 204 near the short sides, which are the portions with insufficient film thickness, are plated thicker. As a result, the entire square substrate can be evenly plated. The number of steps, the number of the feed sides, and the current value can be arbitrarily combined.

Figure 14B:
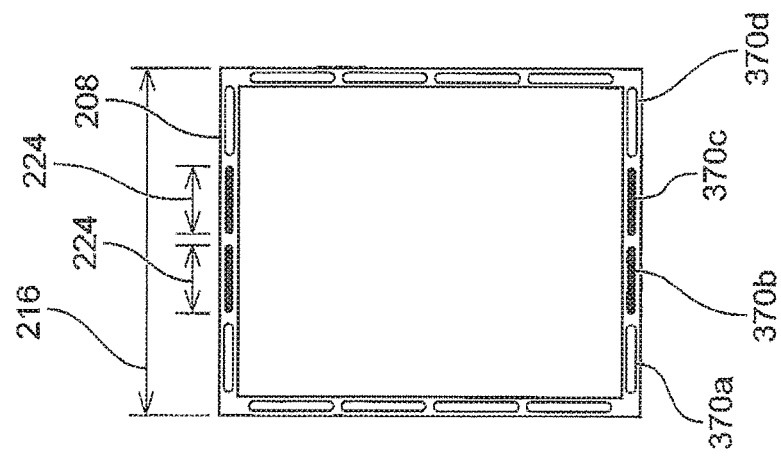
FIGS. 14A, 14B are views showing an embodiment of the present application.
Figure 14A:
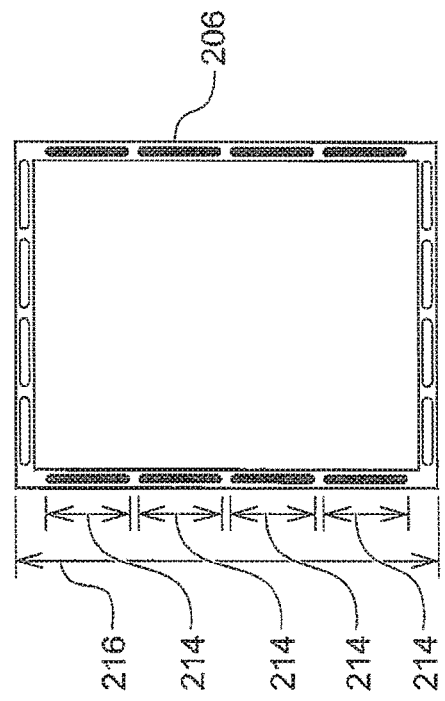
Figure 15A:
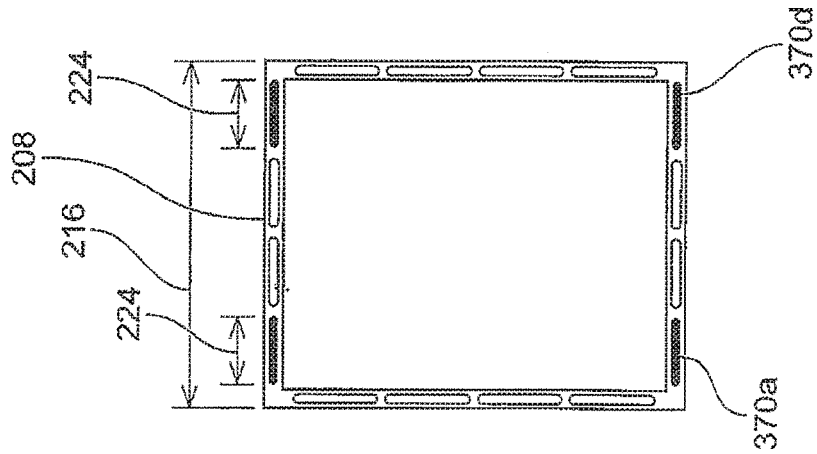
FIGS. 15A, 15B are views showing an embodiment of the present application.
Figure 15B:
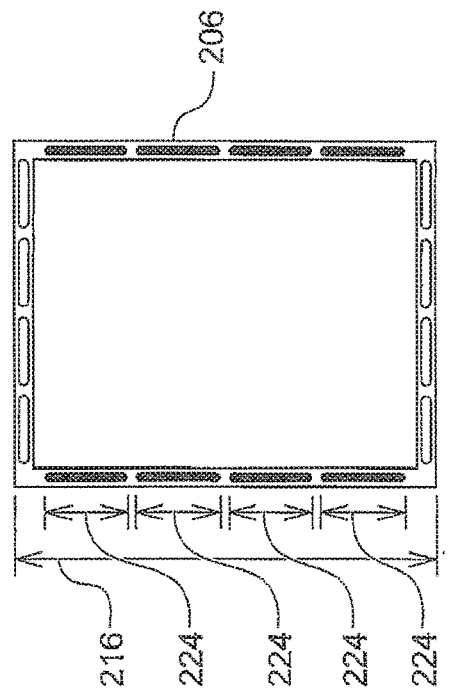

As a specific method of realizing the embodiment shown in FIGS. 8A, 8B, the sum of the lengths of the contacts 370 corresponds to the sum 218 shown in FIGS. 8A, 8B. A specific example of the length of the contact 370 will be described with reference to FIGS. 14A, 14B and 15A, 15B. As already described, there are several contacts 370 on one side. For each contact, it is possible to independently select whether to feed power or not. As shown in FIGS. 14A and 15A, when starting plating, power is fed to all of the contacts 370 on the two long sides 206. Subsequently, as shown in FIGS. 14B and 15B, power is fed to the two short sides 208 to perform plating. At this time, all the contacts 370 on the short sides 208 are not used for feeding power.

In FIG. 14B, power is fed only to two inner contacts 370*b* and 370*c* among a total of four contacts 370*a*, 370*b*, 370*c*, 370*d*. In FIG. 15B, power is fed only to two outer contacts 370*a* and 370*d* among a total of four contacts 370*a*, 370*b*, 370*c*, 370*d*.

Each of the contacts 370 on the short sides 208 has a length 224. The sum of the lengths 224 of the two contacts 370 fed with power on each short side 208 in FIGS. 14B and 15B corresponds to the sum 218 on the short side 208 in FIG. 8B. The same also applies to the long sides 206. As a result, similarly to the example of FIGS. 8A, 8B, the ratio B/A, where A is the length of a side and B is the length of the power feed members, is smaller in the subsequent plating compared to that when the plating is started. Hence, the intermediate portions 204 near the short sides, which are the portions with insufficient film thickness, are plated thicker while restricting an increase in film thickness in the corner portions. As a result, the entire square substrate can be evenly plated.

In addition, the combination of the contacts to be fed with power can be arbitrarily changed without being limited to the examples of FIGS. 14A, 14B and 15A, 15B. A combination of the contacts to be fed with power is determined by considering, for example, the following points. In some substrates Wf, a uniform resist pattern for plating is not present over the entire substrates Wf, and some substrates Wf have partially different resist patterns for plating. As in the conventional methods, in a method in which a current is uniformly applied to the substrate Wf in a single step, it is not possible to correspond to the partial difference in the plating resist patterns, that is, there is a possibility that a uniform film cannot be plated. The above problem can be solved by performing plating by applying a different step and a different current value to only a side (contacts) near an area where the resist pattern for plating is different. Either of a method of changing the current value for each side or a method of changing the current value for each contact according to the partial difference in the plating resist patterns is adopted.

Next, another embodiment will be described with reference to FIGS. 16A, 16B. In the present embodiment, the plating apparatus includes a regulation plate 20 which is mounted between the anode holder 13 and the substrate holder 30. The regulation plate 20 includes the main body part 22 having the polygonal opening 21 along the external shape of the polygonal substrate Wf as described above, and the wall part 23 protruding from the edge of the polygonal opening 21 toward the substrate holder 30. The polygonal opening 21 when plating is started and the polygonal opening 21 thereafter differ in at least one of the shape and the size. The present embodiment can be implemented in combination with the embodiment of FIG. 7A, 7B, 7C.

On a rectangular-type square substrate, two current steps and an electric field shield mask (anode mask, intermediate mask or cathode mask) with variable opening size are combined. In the case of FIGS. 16A, 16B, the electric field shield mask is the regulation plate 20. In general, the plating film thickness tends to be higher near the side being fed with power. It is preferable to adjust the opening of the regulation plate 20 according to the side being fed with power. In each current step, a side to be fed with power can be selected under the control of the control device 17. As one example, two-step plating is performed as shown in FIG. 7A.

According to FIG. 7A, the polygonal opening 21*a* is vertically long when starting plating, and thereafter the polygonal opening 21*a* becomes horizontally longer. An opening size 220 that is a length of the polygonal opening 21 in the direction of the short side 208 shown in FIG. 16A is shorter than an opening size 222 that is a length of the polygonal opening 21 in the direction of the short side 208 shown in FIG. 16B.

When starting plating, power is fed to arbitrarily selected sides (the long sides 206 in the case of FIG. 7A) and plating is performed. Subsequently, power is fed to a side (the short sides 208 in the case of FIG. 7A) different from the sides when the plating is started. Further, plating is performed with different current value. At this time, the opening size of the regulation plate 20 that is a variable mask is also changed from the opening size 220 shown in FIG. 16A to the opening size 222 shown in FIG. 16B, and plating is performed. As a result, the entire substrate Wf can be evenly plated.

In FIGS. 16A, 16B, the current is passed to the first power feed members while shielding the regions of the substrate Wf along the first sides 206 by the electric field shield mask 20, and after elapse of a predetermined time, the shape of the opening 21 is changed and the current is passed to the second power feed members while shielding the regions of the substrate along the second sides 208 by the electric field shield mask 20.

As a mechanism for changing the opening size 220 to the opening size 222, there is a mechanism of manually changing the opening from outside of the plating bath, or a mechanism of automatically changing the opening by a drive mechanism (such as a shutter) for changing the opening size, a drive unit (such as a motor) for driving the drive mechanism, and the control device 17 for controlling the drive unit.

In the conventional square substrate holder 30, in order to switch the power feeding method between the method of feeding power from only two sides and the method of feeding power from four sides, it is necessary to disassemble the substrate holder 30 and detach (or attach) the contacts 370. Therefore, maintenance work is required. Moreover, in order to avoid interrupting the plating work during the maintenance work, a large number of holders are required. As a countermeasure against this problem, the contacts 370 are mounted on the entire periphery of the substrate Wf, and the contacts 370 are switched ON/OFF under the control of the control device 17 to select two sides or four sides to which power is to be fed.

According to this countermeasure, it is possible to switch the sides to which power is to be fed, without the maintenance work, thereby reducing the maintenance man-hour and the number of the holders. Furthermore, plating can also be performed by changing the number of sides to be fed with power, according to the type of the substrate Wf, and the degree of freedom of plating recipes is increased.

Although the examples of the embodiments of the present invention have been described above, the above embodiments of the present invention are described for the purpose of facilitating the understanding of the present invention, and do not limit the present invention. The present invention can be modified and improved without departing from the gist thereof, and the present invention, of course, includes equivalents thereof. Further, any combination or omission of the components described in the claims and the specification is possible within a range in which at least a part of the above-described problems can be solved, or in a range in which the advantageous effect is at least partly exerted.

This application claims priority under the Paris Convention to Japanese Patent Application No. 2018-118164 filed on Jun. 21, 2018. The entire disclosure of Japanese Patent Laid-Open Nos. HEI 09-125294 and 2005-029863, and Japanese Patent Publication No. 03-029876 including specifications, claims, drawings and summaries is incorporated herein by reference in its entirety.

REFERENCE SIGNS LIST

12 Anode
13 Anode holder
14 Bath
17 Control device
18 Anode mask
20 Intermediate mask
20 Regulation plate
21 Polygonal opening
30 Substrate holder
200 Corner portion
202 Central portion
204 Intermediate portion
206 Side
206 Long side
208 Short side
370 Power feed member
370 Contact

What is claimed is:

1. A plating apparatus comprising:
an anode holder configured to hold an anode;
a substrate holder configured to hold a polygonal substrate;
a plating bath configured to accommodate the anode holder and the substrate holder and immerse the anode and the substrate in a plating solution; and
a control device configured to control a current flowing between the anode and the substrate; wherein
the substrate holder has power feed members placed along respective sides of the polygonal substrate,
there are a plurality of groups of the sides, each group including at least one of the sides, at least one of the sides being different between the groups, and
the control device is configured to be capable of controlling a current to be supplied to the power feed members, on a group-by-group basis, during plating.

2. The plating apparatus according to claim 1, wherein there is no side included in both of arbitrary two groups among the plurality of groups.

3. The plating apparatus according to claim 2, wherein the number of the sides is an even number, and
when serial numbers are assigned to the even number of the sides so that adjacent sides have successive numbers, the group including the odd-numbered side and the group including the even-numbered side are present.

4. The plating apparatus according to claim 1, wherein one of the plurality of groups includes a plurality of the sides, and at least one other group different from the one group includes only some of the sides included in the one group.

5. The plating apparatus according to claim 1, wherein the group including the side on which the power feed members to which the current is supplied by the control device when starting plating are placed is different from the group including the side on which the power feed members to which the current is supplied during subsequent plating by the control device are placed.

6. The plating apparatus according to claim 1, wherein the control device is configured to be capable of controlling the current so that a current value when plating is started and a current value during subsequent plating are different.

7. The plating apparatus according to claim 6, wherein the control device is configured to be capable of controlling the current to be supplied to the power feed members so that a ratio which is calculated for each of the sides by dividing the sum of lengths of the power feed members to be supplied with the current, in a side direction in which the power feed members are placed, by a length of the side on which the power feed members are placed differs during the subsequent plating compared to the ratio when the plating is started.

8. The plating apparatus according to claim 6, wherein
the plating apparatus comprises an electric field shield mask provided between the anode holder and the substrate holder,
the electric field shield mask has a polygonal opening along an external shape of the polygonal substrate, and
the polygonal opening when the plating is started and the polygonal opening during the subsequent plating differ in at least one of shape and size.

9. A plating method for plating a polygonal substrate by passing a current between an anode and the polygonal substrate, the plating method comprising:
a step of bringing power feed members into contact with respective sides of the polygonal substrate;
a step of immersing the anode and the polygonal substrate in a plating solution; and
a step of controlling a current to be supplied to the power feed members, wherein
there are a plurality of groups of the sides, each group including at least one of the sides, at least one of the sides being different between the groups, and
in the step of controlling the current, the current to be supplied to the power feed members is controlled, on a group-by-group basis, during plating.

10. A plating apparatus comprising:
an anode holder configured to hold an anode;
a substrate holder configured to hold a polygonal substrate;
a plating bath configured to accommodate the anode holder and the substrate holder and immerse the anode and the polygonal substrate in a plating solution; and
a control device configured to control a current flowing between the anode and the polygonal substrate, wherein
the substrate holder has power feed members placed along respective sides of the polygonal substrate, and
the control device is configured to pass a current independently to a first power feed member placed along a first side of the polygonal substrate and to a second power feed member placed along a second side different from the first side, during plating.

11. The plating apparatus according to claim 10, wherein the polygonal substrate is a rectangular substrate,
the first power feed members are placed along two opposing sides of the rectangular substrate, and
the second power feed members are placed along other two sides orthogonal to the two opposing sides on which the first power feed members are placed.

12. The plating apparatus according to claim 10, wherein the control device is configured to pass the current to the first power feed member during plating, and to pass the current to the second power feed member after a predetermined time has elapsed.

13. The plating apparatus according to claim 12, wherein the control device is configured to stop supplying the current to the first power feed member while the current is passed to the second power feed member.

14. The plating apparatus according to claim 12, wherein the control device is configured to continue to supply the current to the first power feed member while the current is passed to the second power feed member.

15. The plating apparatus according to claim 10, wherein the control device is configured to increase the current to be supplied to at least either of the first power feed member or the second power feed member, during plating.

16. The plating apparatus according to claim 10, wherein a ratio of a length of a portion of the first side in contact with the first power feed member to a length of the first side is different from a ratio of a length of a portion of the second side in contact with the second power feed member to a length of the second side.

17. A plating method for plating a polygonal substrate by passing a current between an anode and the polygonal substrate, the plating method comprising:
a step of bringing power feed members into contact with respective sides of the polygonal substrate; and
a step of immersing the anode and the polygonal substrate in a plating solution, wherein
during plating, a current is independently passed to a first power feed member placed along a first side of the polygonal substrate and to a second power feed member placed along a second side different from the first side.

18. The plating method according to claim 17, wherein the current is passed to the first power feed member, and after a predetermined time has elapsed, the current is passed to the second power feed member.

19. The plating method according to claim 18, further comprising a step of placing an electric field shield mask with an opening portion to partially shield an electric field between the anode and the polygonal substrate, wherein
the current is passed to the first power feed member while shielding a region of the polygonal substrate along the first side by the electric field shield mask, and after a predetermined time has elapsed, the opening portion is changed in shape and the current is passed to the second power feed member while shielding a region of the polygonal substrate along the second side by the electric field shield mask.

20. The plating apparatus according to claim 1, wherein the polygonal substrate is a rectangular substrate.

21. The plating apparatus according to claim 20, wherein one of the plurality of groups includes two long sides facing each other in the rectangular substrate, or one of the plurality of groups includes two short sides facing each other in the rectangular substrate.

* * * * *